United States Patent [19]

Linker

[11] Patent Number: 5,063,975
[45] Date of Patent: Nov. 12, 1991

[54] HAND HELD LEAD STRAIGHTENER

[75] Inventor: Frank V. Linker, Springfield, Pa.

[73] Assignee: American Tech Manufacturing, Corp., Glenolden, Pa.

[21] Appl. No.: 510,297

[22] Filed: May 4, 1990

[51] Int. Cl.⁵ .............................................. B21F 1/02
[52] U.S. Cl. .................................... 140/123; 140/147
[58] Field of Search ........................ 140/106, 123, 147

[56] References Cited

U.S. PATENT DOCUMENTS 2,740,435  4/1956  Pritts ..................................... 140/147
3,401,548  9/1968  Ross et al. ............................ 140/123
4,481,984  11/1984  Linker ................................. 140/147

Primary Examiner—Lowell A. Larson
Attorney, Agent, or Firm—Eugene E. Renz, Jr.

[57] ABSTRACT

A device for straightening leads in which a housing having a outer casing is provided with a fixed separator blade mounted on the outer casing. The case also provides a work rest place for positioning the leads. Also includes is a trigger which is operably connected to the housing and has biasing means urging the trigger in a first position. The trigger is movable to a second position by overcoming the bias. A movable wiper blade is attached to the trigger and has a wiper blade on one end thereof. The blade is movable to engage the separator blade by moving the trigger to the second position. The wiper blade and the fixed separator blade are aligned to conform the orientation of leads positioned by the work rest place.

3 Claims, 2 Drawing Sheets

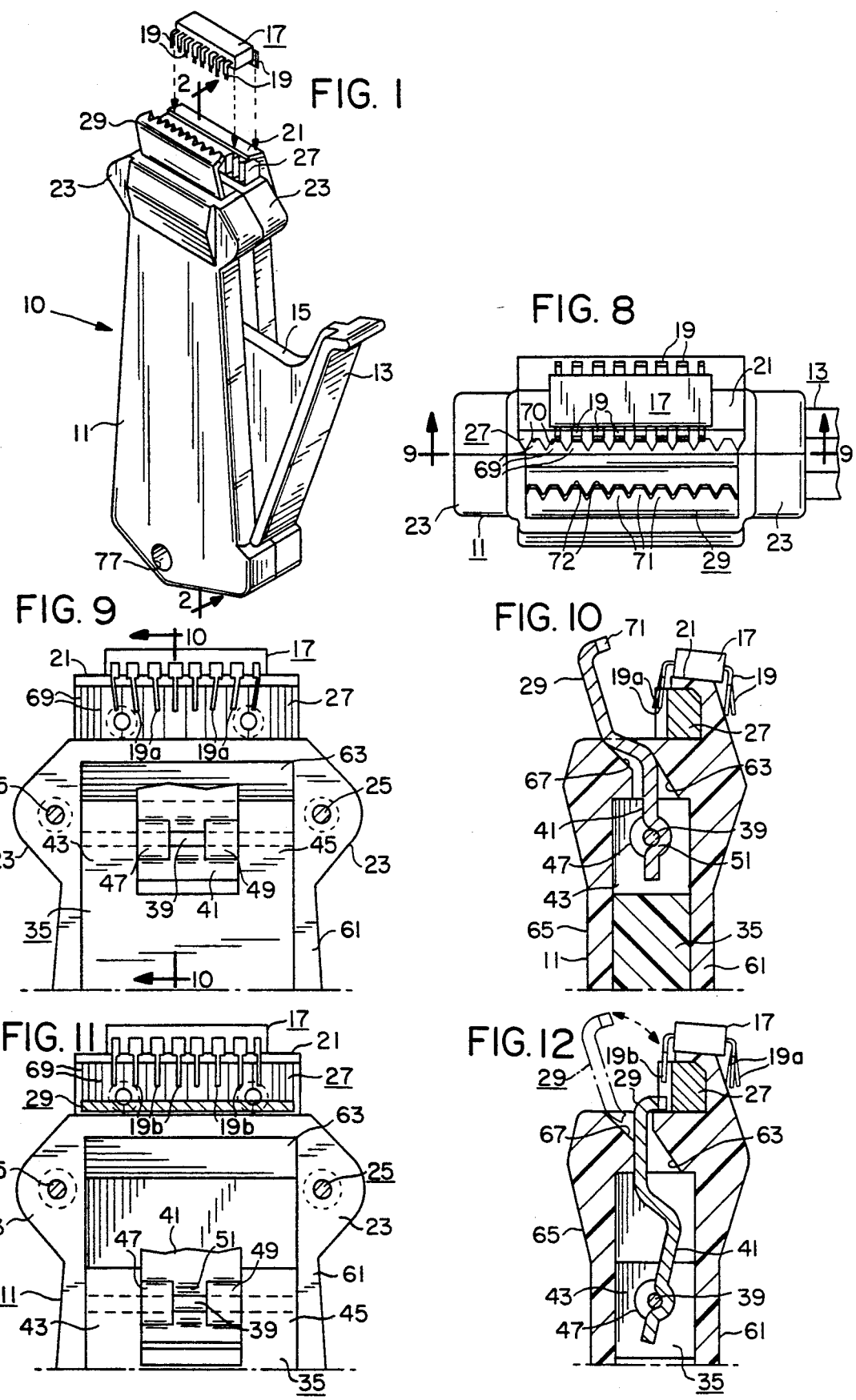

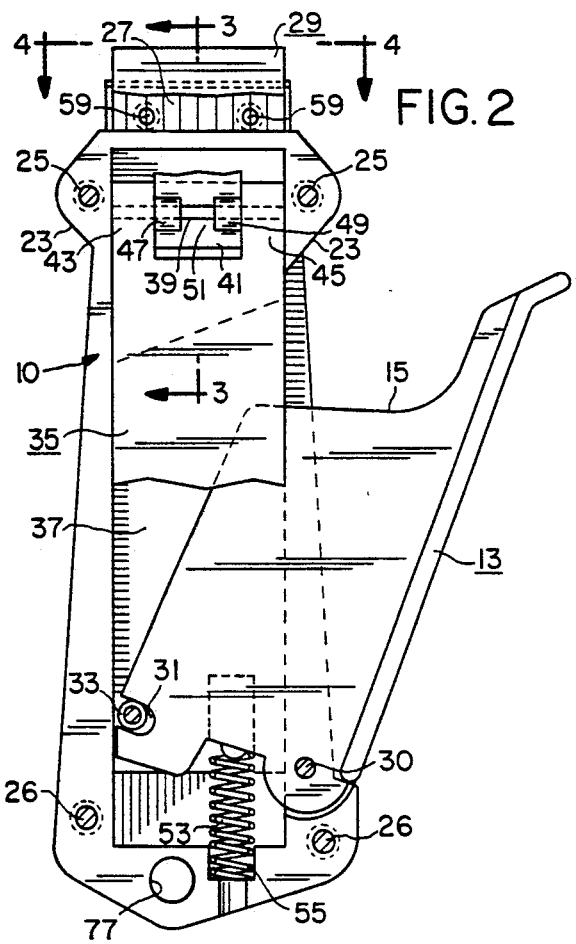
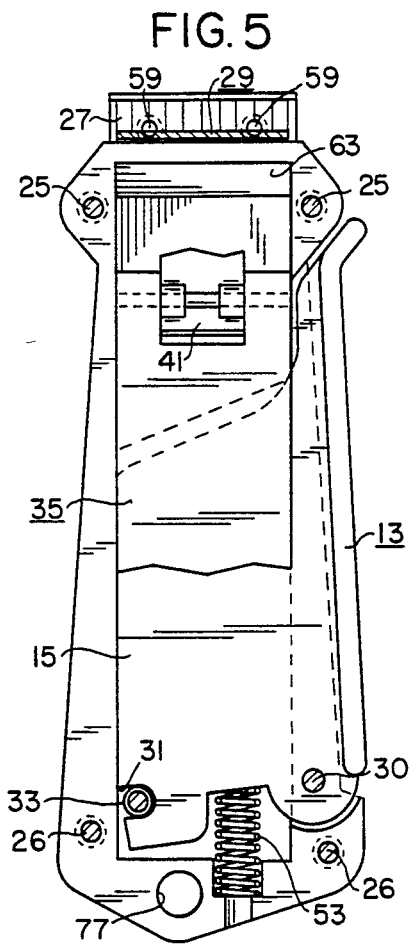
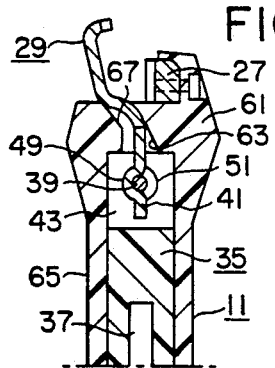
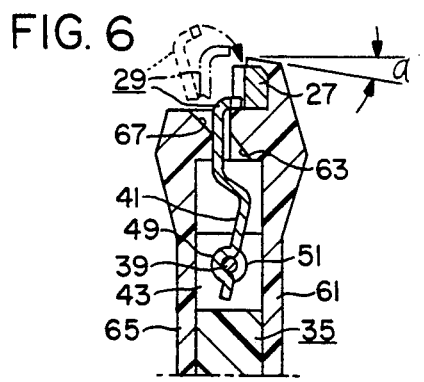
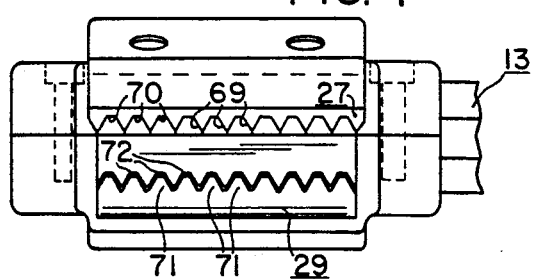
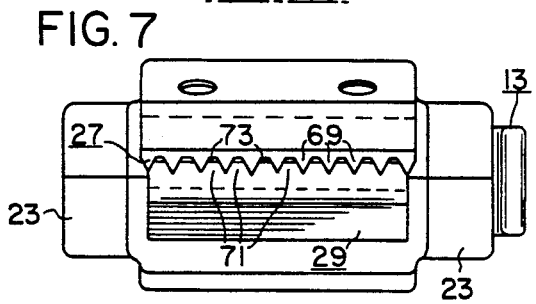

HAND HELD LEAD STRAIGHTENER

FIELD OF THE INVENTION

The present invention relates to a device for straightening leads, particularly for electronic packages and more particularly for aligning the leads of DIP and SIP devices quickly and efficiently without resort to large and complicated machines.

BACKGROUND OF THE INVENTION

DIP devices, SIP devices and other electronic devices include a plurality of pin-like projections or leads, which are relatively fragile and which have a tendency to bend or otherwise become out of alignment during handling and shipment. This kind of damage can distort the leads from a given predetermined orientation which would be necessary for proper installation on a PCB or printed circuit board. That predetermined orientation would be designed to correspond to either the orientation of premounted socket members or to a plurality of openings in the PCB corresponding to the printed pattern on the circuit board base. These types of electronic components typically comprise an elongated generally rectangular body portion, preferably made of molded materials, having operatively integrated therewith a plurality of pin-like leads arranged in one or more rows on opposite side edges of the rectangular shape. They are disposed at a predetermined angular relation to the body to facilitate interconnection with the patterned sockets of a PCB or the like. They may be called single-inline packages and dual-inline packages, which gives rise to the acronym, SIP and DIP.

The particular configurations and method of attachment of the leads to the body portion will differ substantially, according to the particular type of electronic device in question. For appropriate use in a PCB, the leads require a disposition at a predetermined angle in relationship to the body and in substantially parallel mutual association therewith. Of course, the leads must be in straight line succession.

In practice, it is found that the leads can be so disoriented with respect to the body, and/or to one another, so as to render it difficult or even impossible to either manually or automatically dispose the device within the predetermined pattern socket. This disorientation can be in a variety of planes in contrast to the predetermined orientation for appropriate orientation with a PCB. The lead alignment for any device must be correct in three planes and must be within certain design limitations or tolerances in each of these planes for proper association with its intended final location.

One method for high speed electronic component lead forming is disclosed in U.S. Pat. No. 4,665,954. In that patent, leads are disposed in a predetermined and preselected condition of straightness and orientation. A forming station is used with laterally spaced rotatable forming rollers on opposite sides of a trackway. Rollers and anvils have cooperating confronting surfaces to define a nip gap such that leads are contacted to align them in a predetermined orientation and at a predetermined angle relative to the body portion.

U.S. Pat. No. 4,481,984, employs an elongated generally upward angularly disposed elevated trackway and a lead spreader and lead aligning work station. This device uses at least one separator blade having a series of spaced alternating lands and grooves which are oriented to receive the leads of the device. Also associated with the separator blade is a floating blade which has teeth adapted to initially engage between adjacent leads of the device to orient those leads in general relation to the grooves in the separator blade.

U.S. Pat. No. 4,624,160 relates to apparatus and a method for trimming electronic components such as DIP devices. Cutting blades and shear plates are used with a double acting cylinder to produce a sharp clean cut of the leads.

These machines are admirably suited for their intended purposes, and they have had widespread acceptance in the industry, particularly at facilities which manufacture or process large numbers of DIP devices. The reproducibility and accuracy of these machines provides for large volume economy and efficiency. Similarly, machines can be designed to process large numbers of SIP devices. Of course, one machine will not function with both SIP and DIP devices interchangeably.

Nevertheless, in facilities which do not process a high volume of such devices, such as small operations and highly specialized operations, a capital investment for large automated machines may not be justified. In addition, when repairs are being made in the field, it is not possible to take these machines to remote locations, nor is it desirable to send SIP or DIP devices for repair, due to time lost and danger of redamaging the leads.

Accordingly, it would be a great advantage to the art if a simple lead straightening device could be provided which would conform the orientation of leads on an electronic device. It would be of great advantage if this device for straightening leads could be portable and yet maintain substantially all of the accuracy of larger, nonportable machines.

It would also be an advance in the art if such a device could be provided which would separate the lead straightening step from other steps such as cutting, counting, or installing the device.

Objects will appear hereinafter.

SUMMARY OF THE INVENTION

It has now been discovered that the above and other objects of the present invention may be accomplished by a device for straightening leads of electronic packages. This device comprises a housing having an outer casing and fixed separator blade which is mounted on the outer casing and provide a work rest place for positioning the leads. The device also includes a trigger mean which is operably connected to the housing and has a biasing means urging the trigger in a first position. The trigger is movable to a second position by overcoming the bias.

Also provided in the device of this invention is a movable wiper blade attached to the trigger and having a wiper blade on one end thereof. The end with the blade is movable to engage the separator by moving the trigger to the above identified second position. The wiper blades and the fixed separator blade are aligned to conform the orientation of leads positioned on said workplace when the blades are coengaged.

In a preferred embodiment, the trigger is attached to the movable wiper blade by a slide block means which translates movement of a trigger web into movement of the blade. The device is easily held in one hand and can be operated by the one hand while the operator's other hand holds the leads in position on the work rest place. The slide block may be bifurcated such that the trigger web fits between bifurcated portions of the block. The block and the web are movably attached to one another using a trunion pin and slot.

Movement of the wiper blade though the separator blade, while the leads are in position on the work rest place, combs the leads. It is therefore preferred to provide at least one guide surface in the housing to direct the path of the wiper blade.

The present invention is intended for use with SIP devices and DIP devices and with other devices with thin projections, like leads or fingers, which are to be aligned in a plurality of planes.

BRIEF DESCRIPTION OF THE DRAWINGS

These and other objects of the present invention and the various features and details of the operation and construction thereof are hereinafter more fully set forth with reference to the accompanying drawings, where:

FIG. 1 is an isometric view of a hand held lead straightener, with a DIP device poised above the lead straightener and dashed lines indicating a working rest position for the leads during the lead straightening sequence, all in accordance with the invention.

FIG. 2 is an enlarged, sectional elevational view taken along the line 2—2 of FIG. 1, with some parts broken away to clearly show details of construction.

FIG. 3 is a fragmentary sectional view taken along line 3—3 of FIG. 2, showing additional details of construction.

FIG. 4 is an enlarged fragmentary plan view of FIG. 2, taken along the line 4—4 of FIG. 2, illustrating additional details of construction and clearly showing details of the fixed separator blade and the cam actuated wiper blade.

FIG. 5 is a view similar to FIG. 4, but showing the lead straightener device and its movable components repositioned upon the full inward movement of the trigger.

FIG. 6 is a view similar to FIG. 3, but showing the moved position of the cam activated wiper blade from the static or rest position (shown in dot and dash lines) to the fully activated position, shown in full alignment with respect to the fixed separator blade.

FIG. 7 is a view similar to FIG. 4, but showing the fully activated and interengaging relationship of the cam activated wiper blade and the fixed separator blade.

FIG. 8 is a plan view, again similar to FIG. 4, but showing a device having leads to be straightened, in a work rest position atop the hand held lead straightener device.

FIG. 9 is a fragmentary sectional elevational view taken along line 9—9 of FIG. 8, illustrating a device, having leads to be straightened, placed in the work rest position atop the straightener assembly head, one row of leads lying within the triangular shaped pocket of the fixed separator blade and the movable component of the straightener assembly in a rest or static position.

FIG. 10 is a fragmentary sectional view taken along line 10—10 of FIG. 9, showing the relationship of the electronic packages device, work rest position, damaged leads adjacent and within the triangular pockets of the fixed separator blade, and the cam actuated static position of the wiper blade.

FIG. 11 and FIG. 12 are views similar to FIGS. 9 and 10, but showing the package having a row of straightened leads following the full activation of the trigger due to the combing action of the cam activated wiper blade and the fixed separator blade of the hand held lead straightener device.

DETAILED DESCRIPTION OF THE PREFERRED EMBODIMENT

The preferred embodiment of the device for straightening leads is shown in the drawings generally by the reference numeral 10. The device includes a case 11 and trigger 13 which activates a web 15 when the trigger 13 is moved toward the case 11 by squeezing. The device is sized generally to be operated by one hand, such that the case fits in the palm and the trigger 13 can be squeezed using moderate pressure.

The device 10 is intended to operate on all devices which have inline leads, such as SIP and DIP devices. Here the device 10 is shown in use on a DIP device 17 having a plurality of leads 19 extending downwardly. This view in FIG. 1 clearly shows how the "dual-inline packages" acquired the acronym DIP. Single-inline packages and other designs are also intended for use with the present invention.

The DIP device 17 is designed to be placed on a workplace 21 which accurately positions the leads 19 so that they are aligned for straightening. The case 11 accommodates the web 15 to cause the interaction of a fixed separator blade and a wiper blade to comb through the leads.

The case 11 is held together by a series of bolts which attach the two halves of the case 11. Upper ear-shaped portions 23 are fitted with bolts 25 to hold the top portion together. Bottom bolts 26, as shown in FIG. 2, complete the assembly of the case 11.

At the top of the case 11, adjacent the workplace 21 is a fixed separator blade assembly 27 which is aligned to accommodate the leads 19. A movable wiper blade 29 is then moved through the leads 19 in a combing action to align them in the proper orientation.

The web 15 of the trigger 13 fits smoothly between the two halves of the case 11. The web 15 is mounted on a pivot pin 30 and has a groove 31 which slides on trunion 33 when the trigger 13 is pressed to move the web 15 into the case 11 as it pivots about pin 30.

The trunion 33 is mounted on a bifurcated slide block 35, which can be seen in FIG. 3, includes a hollow space 37 to accommodate the thin web 15.

At the other end of the block 35 is a second pivot pin 39. Pin 39 is attached to the wiper blade 29 through a series of three alternating press formed female hinge members on the lower end 41 of the wiper blade 29. The left side 43 and the right side 45 of the slide block 35 support the pivot pin 39. The lower portion 41 of wiper blade 29 includes a left female hinge fastener 47 passing over the pin 39 as does right side female hinge 49, while the center female hinge 51 passes under the pin, as viewed in FIG. 2.

The block 35 is normally biased in an upright position by spring 53, which is fitted into the case 11 in recess 55 and which fits into the slot 57 shown in broken lines in FIG. 2 in block 35. As shown in FIG. 5, when the trigger 13 brings the web 15 into the interior of block 35, the block 35 compresses spring 53 as the web 15 pivots about pivot pin 30 and the trunion 33 moves the block 35 to the bottom of the case 11. This movement of the block 35 will cause the movable wiper blade 29 to comb the leads 19 as the leads 19 are held by the fixed separator blade 27.

The fixed separator blade 27 is attached to the workplace 21 using a plurality of screws 59 so that the separator blade 27 is aligned at a slight angle alpha with respect to a line perpendicular to the separator blade 27. As will be appreciated herein below, the leads 19 have a tendency to spring back when they are moved, and the angle alpha accommodates the spring back to give truly vertically extending leads 19 from the DIP device 17.

The separator blade 27 is located on the right hand portion 61 of casing 11, as shown in FIG. 3. The right hand outer casing 61 includes an interior face 63 which helps to guide the lower portion 41 of the movable wiper blade 29. Similarly, the left half of the outer casing 65 includes an inner face 67 which also locates the position of the movable wiper blade 29. As can be seen in FIGS. 3 and 6, when the slide block 35 is lowered by moving the trigger 13 and web 15 to the interior of the case 11, the block tangs 43 and 45 which hold the pin 39 are pulled down, causing the pin 39 to also lower the wiper blade 29, which is attached at its bottom end 41. As the wiper blade 29 progresses downward, it is guided by face 67 and face 63 to a vertical position and the teeth of the wiper blade 29 passed through the teeth of the fixed separator blade 27, as described hereinafter. This cam action insures smooth movement of the wiper blade as the leads are aligned.

As can be seen in FIG. 8, the fixed separator blade 27 includes a plurality of teeth 69 which have a flat gap 70 at the root of the space between each of the teeth 69. Similarly, the wiper blade 29 has a plurality of teeth 71 which have flat portions 72 at the apex or top thereof. The interengagement of the teeth 69 and 71 provides a space 73 between the flat gap 70 between teeth 69 and the flat portion 72 of teeth 71. This double gap 73 is sized to accommodate leads 19 during the lead straightening process.

As an example of the use of the present invention, a DIP device 17 is placed on the workplace 21 as shown in FIGS. 9 and 10. Leads 19a are non-aligned and are bent both linearly along the length of the DIP device 17 and out of vertical, as can be seen in FIGS. 9 and 10. The DIP device 17 is placed on the surface of the workplace 21 while the trigger 13 is in its extended or relaxed position. The casing inner surfaces 63 and 67 align the wiper blade 29 at a point away from the leads 19a. As the trigger 13 is squeezed, causing the web 15 to pivot above pivot pin 30 and cooperatively move the block 35 to lower position with trunion 33, the lower part 41 of wiper blade 29 is pulled by pin 39 so that teeth 71 interact with teeth 69 to comb the lead 19a and straightening them in the appropriate position 19b as shown in FIGS. 11 and 12. The wiper blade 29 passes completely through the leads 19b and comes to rest on the outer casing 61, where upon the DIP device 17 can be removed and the trigger 13 released. The DIP device then is reversed so that the other side leads 19a can also be straightened.

As can be appreciated, this device for straightening leads is handy and effective at quickly straightening leads in the factory or in the field. A hole 77 is provided for a strap or cord for convenience purposes. It can be used on a variety of electronic packages having at least one inline row of leads on the package.

While the present invention has been shown for one preferred embodiment, it is clear that a variety of modifications and other embodiments are possible while keeping within the spirit of the present invention.

What is claimed is:

1. A device for straightening leads of an electronic component comprising:
    a housing;
    a fixed separation blade mounted at one end of the housing having a series of side by side first teeth defining therebetween spaces for receiving leads;
    a movable wiper blade having a series of second teeth actuatable through a straightening cycle wherein they interengage in the spaces of said fixed separation blade to straighten leads from a first position wherein the teeth are spaced apart to permit positioning of an electronic component on a seat of said separation blade and a second position at the end of said straightening cycle;
    a trigger mounted in said housing and operatively connected to said movable wiper blade;
    biasing means normally urging said trigger to position the movable blade in said first position, said wiper blade movable by said trigger to said second position wherein said blade is moved completely through the leads to permit removal of the electronic component from the seat before release of the trigger which returns said removable wiper blade to said first position.

2. A device as claimed in claim 1 wherein said housing is of a predetermined size capable of being supported in one hand.

3. The device of claim 1 wherein said trigger is of a predetermined size to be operated by the same hand holding in which said device is supported.

* * * * *